(12) United States Patent
Yamato

(10) Patent No.: US 9,166,559 B2
(45) Date of Patent: Oct. 20, 2015

(54) CIRCUIT MODULE AND COMPOSITE CIRCUIT MODULE

(75) Inventor: Syuji Yamato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 356 days.

(21) Appl. No.: 13/554,159

(22) Filed: Jul. 20, 2012

(65) Prior Publication Data

US 2013/0027156 A1 Jan. 31, 2013

(30) Foreign Application Priority Data

Jul. 29, 2011 (JP) ................................ 2011-166202

(51) Int. Cl.
*H03H 9/64* (2006.01)
*H03H 9/72* (2006.01)
*H03H 9/05* (2006.01)

(52) U.S. Cl.
CPC ............. *H03H 9/725* (2013.01); *H03H 9/0566* (2013.01)

(58) Field of Classification Search
CPC .............................. H03H 9/725; H03H 9/0566
USPC .......................................................... 333/193
See application file for complete search history.

(56) References Cited

U.S. PATENT DOCUMENTS

| 5,212,115 | A * | 5/1993 | Cho et al. ........................ 438/51 |
| 6,456,172 | B1 * | 9/2002 | Ishizaki et al. ................ 333/133 |
| 7,944,325 | B2 * | 5/2011 | Korden ......................... 333/132 |
| 2002/0057141 | A1 * | 5/2002 | Nishizawa et al. ........... 333/193 |
| 2005/0042804 | A1 * | 2/2005 | Kim et al. ..................... 438/110 |
| 2005/0287789 | A1 * | 12/2005 | Tunaboylu .................... 438/622 |
| 2007/0252481 | A1 | 11/2007 | Iwamoto et al. |
| 2010/0289600 | A1 | 11/2010 | Takada et al. |
| 2011/0074046 | A1 * | 3/2011 | Sunohara et al. ............. 257/778 |
| 2011/0221546 | A1 * | 9/2011 | Yamaji et al. ................. 333/193 |

FOREIGN PATENT DOCUMENTS

| JP | 2002-217673 A | 8/2002 |
| JP | 2002-261582 A | 9/2002 |
| JP | 2002-299996 A | 10/2002 |
| JP | 2003-101382 A | 4/2003 |
| JP | 2004-120524 A | 4/2004 |
| JP | 2006-005433 A | 1/2006 |
| JP | 2006-304145 A | 11/2006 |

(Continued)

OTHER PUBLICATIONS

Machine Translation of Yagi et al., JP 2008-301066, translated Jul. 29, 2014.*

(Continued)

*Primary Examiner* — Stephen E Jones
*Assistant Examiner* — Scott S Outten
(74) *Attorney, Agent, or Firm* — Keating & Bennett, LLP

(57) ABSTRACT

A SAW filter includes a piezoelectric substrate, a longitudinal coupling portion disposed on a main surface of the piezoelectric substrate, a support layer and cover layers covering the main surface of the piezoelectric substrate with an air gap on the longitudinal coupling portion, and bumps that are disposed on one of the cover layers and are electrically connected to the longitudinal coupling portion. A mount board is mounted on a motherboard. The SAW filter is mounted on the mount board via the bumps.

6 Claims, 9 Drawing Sheets

(56) References Cited

FOREIGN PATENT DOCUMENTS

| JP | 2008-011125 A | | 1/2008 |
|---|---|---|---|
| JP | 2008301066 A | * | 12/2008 |
| JP | 2010-278971 A | | 12/2010 |
| WO | 2006/134928 A1 | | 12/2006 |
| WO | 2009/104438 A1 | | 8/2009 |

OTHER PUBLICATIONS

Amy et al., Accuracy of Simplified Printed Circuit Board Finite Element Models, Oct. 17, 2009, Microelectronics Reliability 50 (2010) p. 86-97.*

Official Communication issued in corresponding Japanese Patent Application No. 2011-166202, mailed on Jul. 23, 2013.

* cited by examiner

CIRCUIT MODULE AND COMPOSITE CIRCUIT MODULE

BACKGROUND OF THE INVENTION

1. Field of the Invention

The present invention relates to circuit modules and composite circuit modules, and, more particularly, to a circuit module and a composite circuit module provided with a surface acoustic wave filter including a piezoelectric element.

2. Description of the Related Art

Examples of a circuit module in the related art include an electronic component apparatus disclosed in Japanese Unexamined Patent Application Publication No. 2002-299996. FIG. 9 is a cross-sectional view of an electronic component apparatus 500 disclosed in Japanese Unexamined Patent Application Publication No. 2002-299996.

The electronic component apparatus 500 includes a SAW device 502 and a base 504. The SAW device 502 includes a piezoelectric monocrystal substrate 506 and a substantially comb-shaped electrode 508. The substantially comb-shaped electrode 508 is disposed on the piezoelectric monocrystal substrate 506. The SAW device 502 is disposed on the base 504 via bumps so that the substantially comb-shaped electrode 508 faces the base 504. The electronic component apparatus 500 having the above-described structure is mounted on, for example, a motherboard when being used.

When the electronic component apparatus 500 is heated and cooled in a reflowing process, a connection in the electronic component apparatus 500 may be broken. More specifically, the piezoelectric monocrystal substrate 506 in the electronic component apparatus 500 is made of, for example, lithium tantalite. The base 504 is made of, for example, ceramics such as alumina. A motherboard is made of, for example, glass epoxy. Lithium tantalite, alumina, and glass epoxy have different material properties such as a coefficient of linear expansion and a Young's modulus. Accordingly, when the electronic component apparatus 500 is heated and cooled in a reflowing process, the SAW device 502, the base 504, and a motherboard are deformed in different ways. As a result, in the electronic component apparatus 500, a connection may be broken. The inventor of the invention described and claimed in the present application discovered via computer simulation that the connection between the SAW device 502 and the base 504 is easily broken.

SUMMARY OF THE INVENTION

Preferred embodiments of the present invention provide a circuit module and a composite circuit module that prevent a connection therein from being broken or damaged when being heated and cooled.

A circuit module according to a preferred embodiment of the present invention includes a surface acoustic wave filter and a multilayer substrate. The surface acoustic wave filter includes a piezoelectric substrate, a surface acoustic wave element disposed on a main surface of the piezoelectric substrate, a cover layer covering the main surface of the piezoelectric substrate with an air gap on the surface acoustic wave element, and a connection portion that is disposed on the cover layer and is electrically connected to the surface acoustic wave element. The multilayer substrate is a substrate on which the surface acoustic wave filter is mounted via the connection portion and which is mounted on a motherboard.

A composite circuit module according to a preferred embodiment of the present invention includes the circuit module and a motherboard on which the circuit module is mounted.

According to a preferred embodiment of the present invention, it is possible to prevent breaking of or damage to a connection in an apparatus when the apparatus is heated and cooled.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A circuit module according to a preferred embodiment of the present invention and a composite circuit module according to a preferred embodiment of the present invention will be described below with reference to the accompanying drawings.

Figure 1:
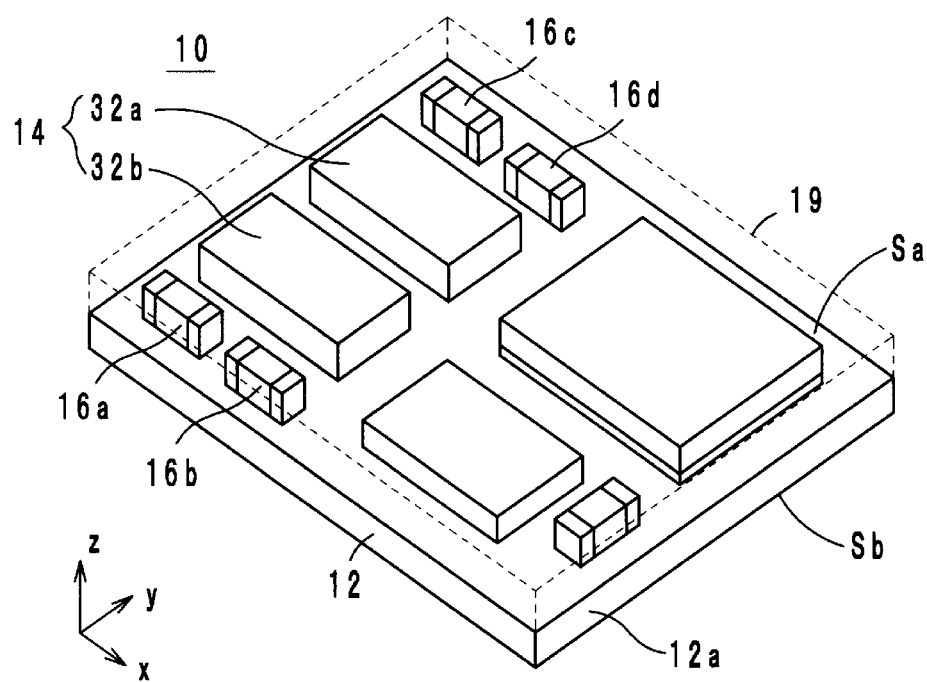
FIG. 1 is an external perspective view of a circuit module according to a preferred embodiment of the present invention.
Figure 2:
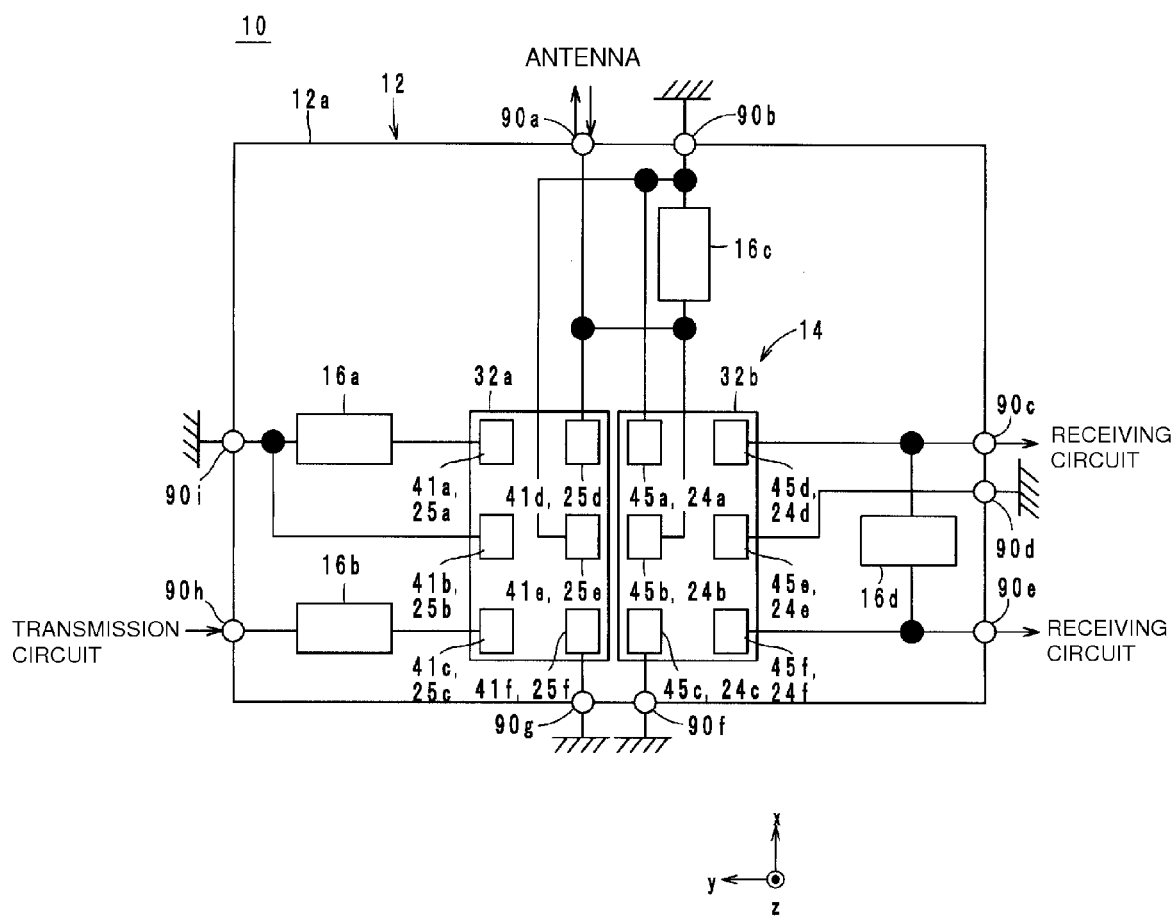
FIG. 2 is a diagram illustrating a circuit configuration of the circuit module illustrated in FIG. 1.

The structure of a circuit module according to a preferred embodiment of the present invention will be described below with reference to the accompanying drawings. FIG. 1 is an external perspective view of a circuit module 10 according to a preferred embodiment of the present invention. FIG. 2 is a diagram illustrating the circuit configuration of the circuit module 10 illustrated in FIG. 1. A height direction of the circuit module 10 that preferably has a substantially rectangular parallelepiped shape, for example, is defined as a z-axis direction. Lengthwise and widthwise directions of the circuit module 10 in plan view from the z-axis direction are defined as x-axis and y-axis directions, respectively. An x axis, a y axis, and a z axis are orthogonal to one another.

As illustrated in FIGS. 1 and 2, the circuit module 10 includes a mount board 12, a duplexer 14, matching elements 16a to 16d, and a sealing resin 19.

As illustrated in FIG. 1, the mount board 12 preferably is a substantially rectangular ceramic multilayer substrate obtained by laminating a plurality of insulating layers, and is mounted on, for example, the motherboard of a mobile telephone. A material for the mount board 12 preferably is, for example, Low Temperature Co-fired Ceramics (LTCC). The mount board 12 includes a substrate body 12a and land electrodes 41a to 41f, 45a to 45f, and 90a to 90i (see FIG. 2).

The substrate body 12a includes main surfaces Sa and Sb (see FIG. 1). The main surface Sa extends in the positive z-axis direction, and the main surface Sb extends in the negative z-axis direction.

The land electrodes 41a to 41f and 45a to 45f are used to mount the duplexer 14, and are disposed on the main surface Sa (first main surface) of the substrate body 12a. The land electrodes 90a to 90i are used to mount the mount board 12 on a motherboard, and are disposed on the main surface Sb (second main surface) of the substrate body 12a. The land electrode 90a is connected to an antenna via a motherboard (not illustrated). The land electrodes 90c and 90e are connected to a receiving circuit via the motherboard. The land electrode 90h is connected to a transmission circuit via the motherboard. The land electrodes 90b, 90d, 90f, 90g, and 90i are connected to the ground via the motherboard.

The duplexer 14 preferably is a branching circuit that outputs a relatively high-frequency receiving signal received by an antenna (not illustrated) to a receiving circuit (not illustrated) in the circuit module 10 and to output a relatively low-frequency transmission signal output from a transmission circuit (not illustrated) in the circuit module 10 to the antenna. The duplexer 14 is disposed on the main surface Sa of the mount board 12 as illustrated in FIG. 1, and includes SAW filters 32a and 32b as illustrated in FIGS. 1 and 2. The frequency of the transmission signal may be higher than that of the receiving signal. The receiving circuit and the transmission circuit may be disposed outside the circuit module 10.

The SAW filter 32a is disposed between a transmission circuit and an antenna as illustrated in FIG. 2, and has a characteristic with which a relatively low-frequency transmission signal is transmitted from the transmission circuit to the antenna and a relatively high-frequency receiving signal is not transmitted from the antenna to the transmission circuit. The SAW filter 32b is disposed between an antenna and a receiving circuit as illustrated in FIG. 2, and has a characteristic with which a relatively high-frequency receiving signal is transmitted from the antenna to the receiving circuit and a relatively low-frequency transmission signal is not transmitted from a transmission circuit to the receiving circuit.

Figure 3:
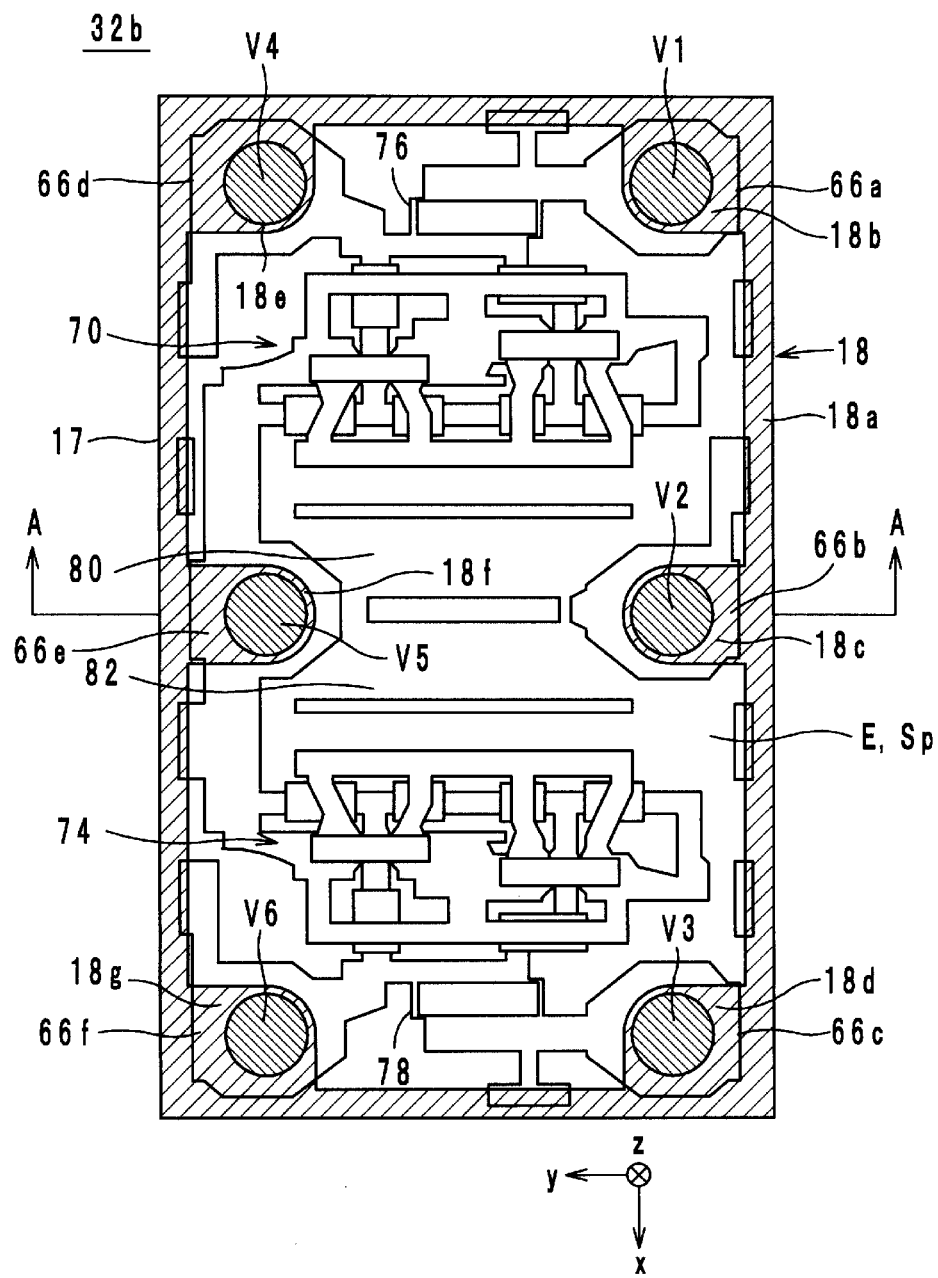
FIG. 3 is a diagram illustrating an internal structure of a SAW filter.
Figure 4:
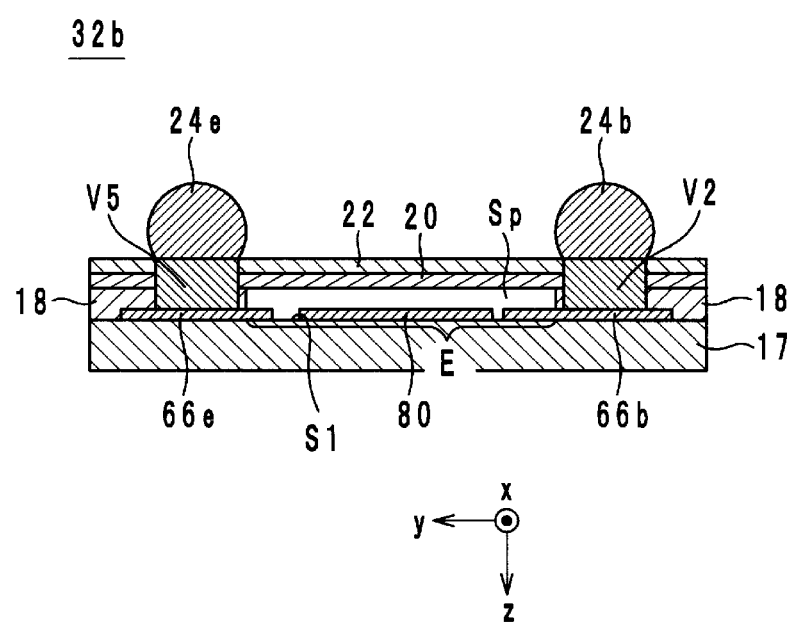
FIG. 4 is a cross-sectional view of the SAW filter.
Figure 5:
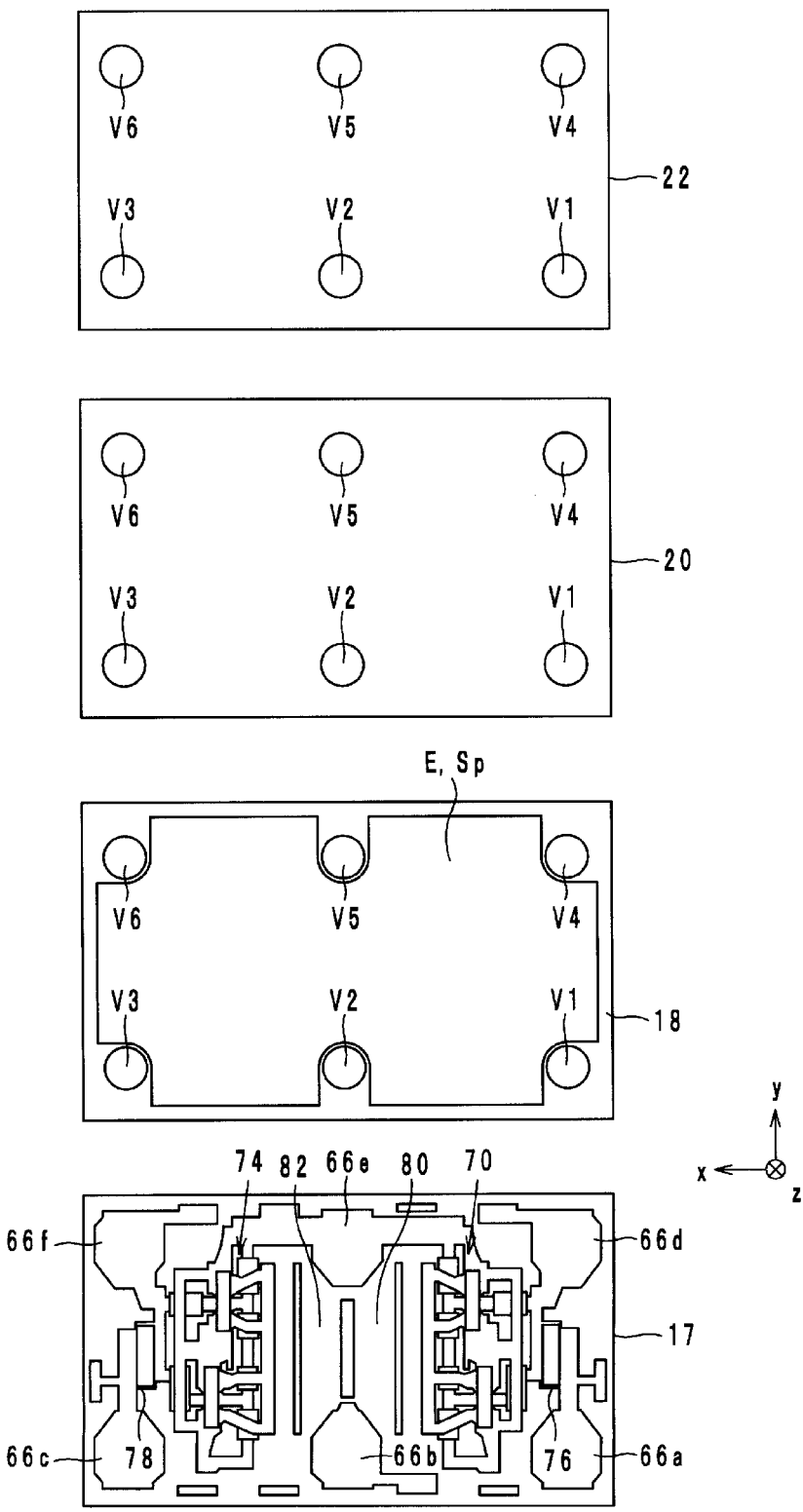
FIG. 5 is an exploded view of the SAW filter.
Figure 6:
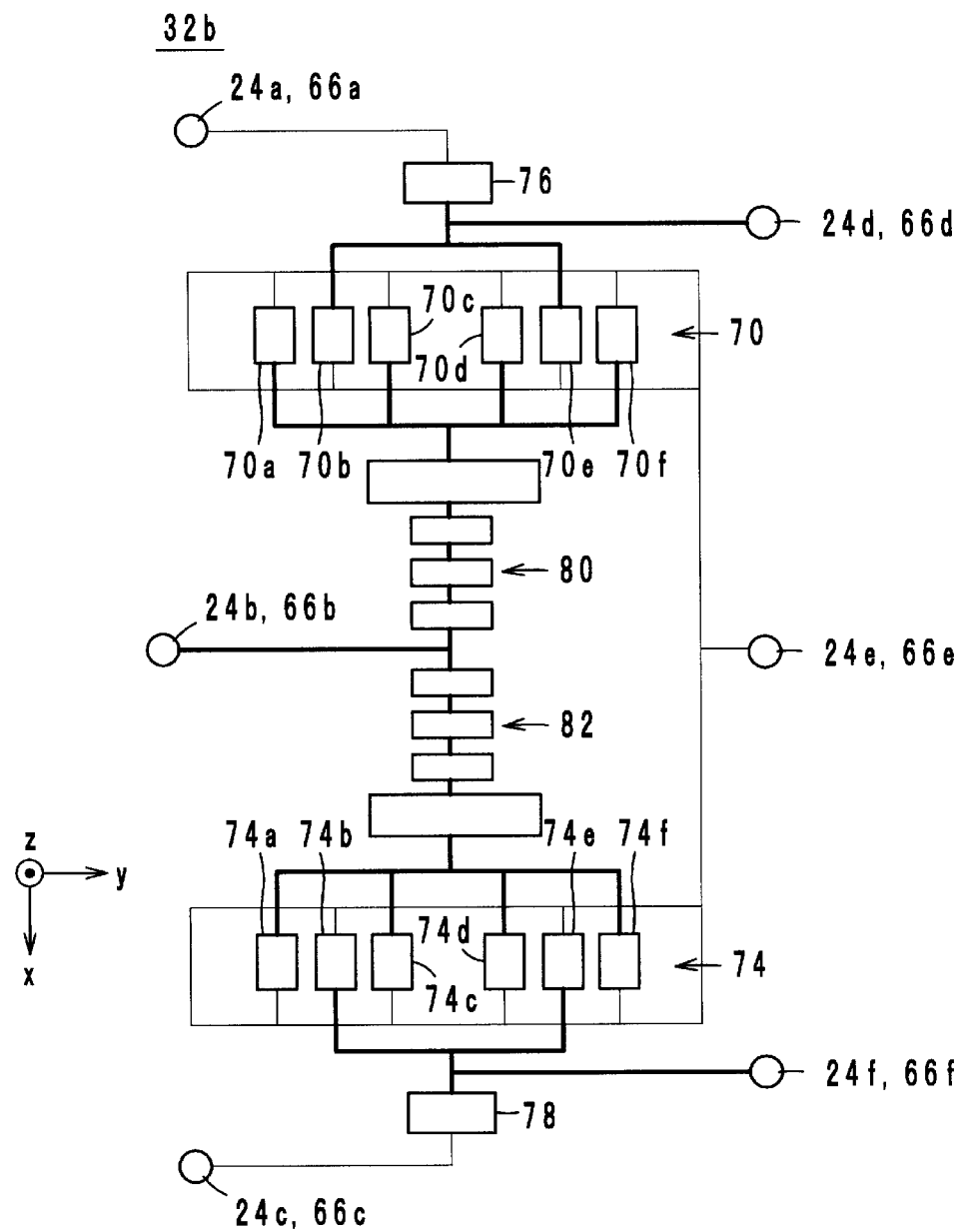
FIG. 6 is a wiring diagram of the SAW filter.
Figure 7:
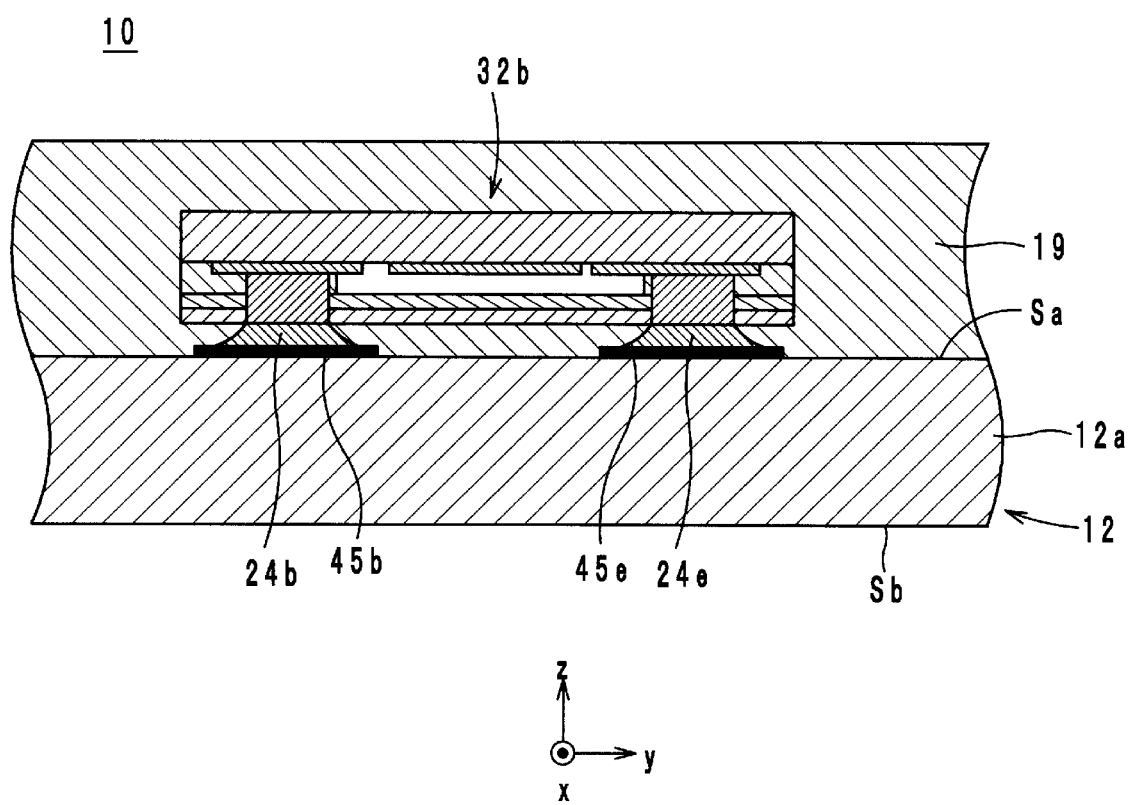
FIG. 7 is a cross-sectional view of the circuit module.

The structure of the SAW filters 32a and 32b will be described with reference to the accompanying drawings. Since the SAW filters 32a and 32b have substantially the same basic structure, the SAW filter 32b will be described by way of example. FIG. 3 is a diagram illustrating the internal structure of the SAW filter 32b. FIG. 4 is a cross-sectional view of the SAW filter 32b. FIG. 5 is an exploded view of the SAW filter 32b. FIG. 6 is a wiring diagram of the SAW filter 32b. Referring to FIG. 6, a signal line is represented by a heavy line and a ground line is represented by a thin line. A signal line is a wiring line through which a receiving signal is transmitted. A ground line is a line held at a ground potential. FIG. 7 is a cross-sectional view of the circuit module 10.

As illustrated in FIGS. 3 to 6, the SAW filter 32b preferably includes a piezoelectric substrate 17, a support layer 18, cover layers 20 and 22, bumps (connection portions) 24 (24a to 24f), connection portions 66 (66a to 66f), longitudinal coupling portions (surface acoustic wave elements) 70 and 74, shunt traps 76 and 78, series traps 80 and 82, and via-hole conductors V1 to V6, for example.

The piezoelectric substrate 17 preferably is a substantially rectangular plate, and includes a main surface S1 (see FIG. 4). As the piezoelectric substrate 17, a lithium tantalate sodium substrate, a lithium tantalate niobate substrate, or a silicon substrate is preferably used, for example. The main surface S1 is one of two main surfaces of the piezoelectric substrate 17 extending in the negative z-axis direction.

As illustrated in FIGS. 3 and 4, on the main surface S1 of the piezoelectric substrate 17, an element region E is set. The element region E is a region except for corner portions and side portions on the main surface S1.

Each of the connection portions 66a to 66f is a conductive layer made of Al, Cu, Ni, Au, or Pt on the main surface S1. As illustrated in FIG. 3, the connection portions 66a, 66c, 66d, and 66f are individually disposed near four corners of the main surface S1. As illustrated in FIG. 3, the connection portions 66b and 66e are individually disposed near the midpoints of long sides of the main surface S1 in the negative and positive y-axis directions.

Each of the longitudinal coupling portions (surface acoustic wave elements) 70 and 74, the shunt traps 76 and 78, and the series traps 80 and 82 is a conductive layer made of Al, Cu, Ni, Au, or Pt on the main surface S1, and is disposed in the element region E when viewed in plan from the z-axis direction as illustrated in FIGS. 3 and 5.

As illustrated in FIGS. 3, 5, and 6, between the connection portions 66d and 66b, the longitudinal coupling portion 70 and the series trap 80 are connected in series. The longitudinal coupling portion 70 includes facing portions 70a to 70f. Each of the facing portions 70a, 70c, 70d, and 70f is obtained by making the ground line connected to the connection portion 66e and a signal line connected to the connection portion 66b via the series trap 80 face each other in the z-axis direction. Each of the facing portions 70b and 70e is obtained by making a signal line connected to the connection portion 66d and the ground line connected to the connection portion 66e face each other in the z-axis direction. The facing portions 70a to 70f are arranged in this order from the negative y-axis direction to the positive y-axis direction.

The series trap 80 preferably is a resonator connected in series between the longitudinal coupling portion 70 and the connection portion 66b. The shunt trap 76 preferably is a resonator connected in series between the connection portions 66d and 66a.

Between the connection portions 66f and 66b, the longitudinal coupling portion 74 and the series trap 82 are connected in series. The longitudinal coupling portion 74 includes facing portions 74a to 74f. Each of the facing portions 74a, 74c, 74d, and 74f is obtained by arranging the ground line connected to the connection portion 66e and a signal line connected to the connection portion 66b via the series trap 82 so as to face each other in the z-axis direction. Each of the facing portions 74b and 74e is obtained by arranging a signal line connected to the connection portion 66f and the ground line connected to the connection portion 66e so as to face each other in the z-axis direction. The facing portions 74a to 74f are arranged in this order from the negative y-axis direction to the positive y-axis direction.

The series trap 82 preferably is a resonator connected in series between the longitudinal coupling portion 74 and the connection portion 66b. The shunt trap 78 preferably is a resonator connected in series between the connection portions 66f and 66c.

As illustrated in FIGS. 3 to 5, the support layer 18 and the cover layers 20 and 22 cover the main surface S1 of the piezoelectric substrate 17 with an air gap Sp on the longitudinal coupling portions 70 and 74, the shunt traps 76 and 78, and the series traps 80 and 82.

As illustrated in FIGS. 3 to 5, the support layer 18 is a substantially rectangular frame surrounding the element region E in plan view from the z-axis direction. More specifically, as illustrated in FIG. 3, the support layer 18 includes a frame portion 18a and protrusion portions 18b to 18g. The frame portion 18a preferably is a substantially rectangular frame along four sides of the main surface S1. The protrusion portions 18b, 18d, 18e, and 18g individually protrude from four corners of the main surface S1 toward the inside of the frame portion 18a. The protrusion portions 18c and 18f individually protrude from midpoints of the long sides of the main surface S1 in the positive and negative y-axis directions toward the inside of the frame portion 18a. As illustrated in FIG. 3, the protrusion portions 18b to 18g overlap the connection portions 66a to 66f, respectively in plan view from the z-axis direction. The support layer 18 protects the SAW filter 32b from water, and is made of an insulating material (for example, polyimide) that is highly resistant to water. The element region E is a region on the main surface S1 in which the support layer 18 is not located.

As illustrated in FIGS. 4 and 5, the cover layer 20 extends in the negative z-axis direction with respect to the support layer 18 and faces the main surface S1. More specifically, the cover layer 20 preferably has substantially the same rectangular shape as the main surface S1. The cover layer 20 is laminated on the support layer 18 in the negative z-axis direction and faces the main surface S1 with the air gap Sp therebetween. The cover layer 20 may be made of an insulating material different from that for the support layer 18, and is made of, for example, an epoxy resin.

As illustrated in FIGS. 4 and 5, the cover layer 22 extends in the negative z-axis direction with respect to the cover layer 20. More specifically, the cover layer 22 has substantially the same rectangular shape as the cover layer 20, and entirely overlaps the cover layer 20 in plan view from the z-axis direction. The cover layer 22 protects the SAW filter 32b from water, and is made of an insulating material (for example polyimide) that is highly resistant to water. That is, the cover layer 22 is made of the same insulating material as the support layer 18. The cover layer 22 is formed after the support layer 18 has hardened. Accordingly, in a case where the cover layer 22 is directly laminated on the support layer 18, the cover layer 22 is not brought into full contact with the support layer 18. In the SAW filter 32b, the cover layer 20 is therefore disposed between the support layer 18 and the cover layer 22. That is, the cover layer 20 joins the support layer 18 and the cover layer 22. The cover layers 20 and 22 may be made of another material and have different thicknesses. A material for the cover layers 20 and 22 may be a flexible material such as a resin or a rigid material such as a monocrystal substrate, for example.

As illustrated in FIGS. 3 to 5, the via-hole conductors V1 to V6 pass through the support layer 18 and the cover layers 20 and 22 in the z-axis direction. Ends of the via-hole conductors V1 to V6 in the positive z-axis direction are connected to the connection portions 66a to 66f, respectively.

The bumps 24a to 24f are spherical solder bumps arranged on the main surface of the cover layer 22 in the negative z-axis direction, and are connected to the ends of the via-hole conductors V1 to V6 in the negative z-axis direction, respectively. As a result, the bumps 24a to 24f are electrically connected to the longitudinal coupling portions (surface acoustic wave elements) 70 and 74, the shunt traps 76 and 78, and the series traps 80 and 82 via the via-hole conductors V1 to V6 and the connection portions 66a to 66f.

As illustrated in FIGS. 2 and 7, the bumps 24a to 24f are connected to the land electrodes 45a to 45f of the mount board 12, respectively, when the SAW filter 32b is mounted on the mount board 12. More specifically, as illustrated in FIG. 2, the bumps 24a, 24c, and 24e are connected to the land electrodes 45a, 45c, and 45e of the mount board 12, respectively, and are connected to the ground via the mount board 12 and a motherboard. The bump 24b is connected to the land electrode 45b of the mount board 12, and is connected to an antenna via the mount board 12 and the motherboard. The bumps 24d and 24f are connected to the land electrodes 45d and 45f of the mount board 12, respectively, and are connected to a receiving circuit via the mount board 12 and the motherboard. As a result, the SAW filter 32b is mounted on the main surface Sa of the mount board 12 via the bumps 24a to 24f.

The operation of the SAW filter 32b having the above-described structure will be described. When a receiving signal is input from the bump 24b via the series trap 80, a surface acoustic wave is generated at the facing portions 70a, 70c, 70d, and 70f. The surface acoustic wave propagates on the surface of the piezoelectric substrate 17. The facing portions 70b and 70e convert the surface acoustic wave generated at the facing portions 70a, 70c, 70d, and 70f into a receiving signal. The receiving signal is externally output from the SAW filter 32b via the bump 24d.

The receiving signal input from the bump 24b is input into the facing portions 74a, 74c, 74d, and 74f via the series trap 82 and a surface acoustic wave is generated at the facing portions 74a, 74c, 74d, and 74f. The surface acoustic wave propagates on the surface of the piezoelectric substrate 17. The facing portions 74b and 74e convert the surface acoustic wave generated at the facing portions 74a, 74c, 74d, and 74f into a receiving signal. The receiving signal is externally output from the SAW filter 32b via the bump 24f. A signal passing through the facing portions 70 and a signal passing through the facing portions 74 are 180° out of phase. The bumps 24d and 24f define a balanced receiving terminal.

Figure 8:
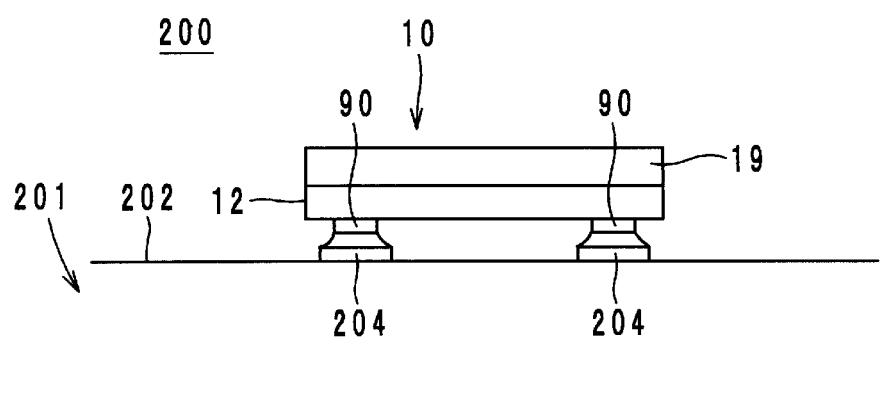
FIG. 8 is a diagram illustrating a structure of a composite circuit module.
Figure 8:
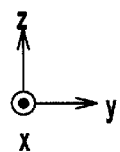
Figure 9:
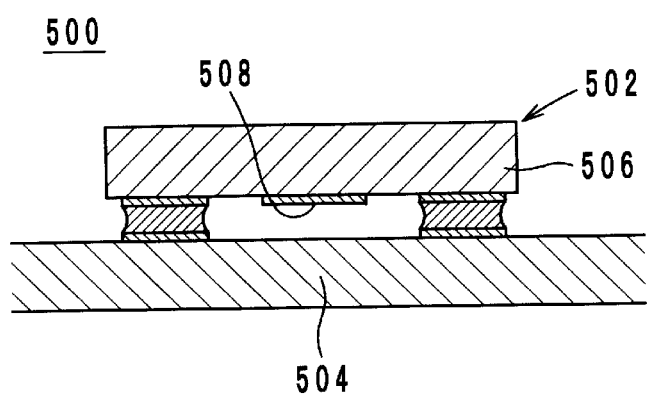
FIG. 9 is a cross-sectional view of an electronic component apparatus disclosed in Japanese Unexamined Patent Application Publication No. 2002-299996.

The circuit module 10 having the above-described structure is mounted on a motherboard. A composite circuit module 200 including the circuit module 10 and a motherboard will be described below with reference to the accompanying drawing. FIG. 8 is a diagram illustrating the structure of the composite circuit module 200.

A motherboard 201 includes a substrate body 202 and land electrodes 204. The substrate body 202 preferably is a substrate made of a resin such as glass epoxy, for example. The land electrodes 204 are disposed on the surface of the substrate body 202 in the positive z-axis direction.

The land electrodes 90 of the mount board 12 and the land electrodes 204 of the motherboard 201 are soldered. As a result, the mount board 12 is mounted on the motherboard 201 via the land electrodes 90.

As illustrated in FIG. 1, the matching elements 16a to 16d are chip electronic components that are mounted on the main surface Sa of the mount board 12 and perform impedance matching between the mount board 12 and the duplexer 14. As illustrated in FIG. 2, the matching elements 16a, 16b, and 16c are matching elements connected in series between the land electrodes 41a, 41c, and 45b and the land electrodes 90i, 90h, and 90b, respectively. The matching element 16d is a matching element connected between a signal line that connects the land electrodes 45d and 90c and a signal line that connects the land electrodes 45f and 90e.

The sealing resin 19 covers the main surface Sa of the mount board 12, the duplexer 14, and the matching elements 16a to 16d. As a result, the duplexer 14 and the matching elements 16a to 16d are protected. The sealing resin 19 is, for example, an epoxy resin.

In the circuit module 10 and the composite circuit module 200, the mount board 12, the piezoelectric substrate 17, the cover layers 20 and 22, and the motherboard 201 have the following Young's moduli. Table 1 indicates the Young's moduli of the mount board 12, the piezoelectric substrate 17, the cover layers 20 and 22, and the motherboard 201.

TABLE 1

| | Material | Young's modulus (GPa) |
|---|---|---|
| The piezoelectric substrate 17 | lithium tantalite | approximately 200 to approximately 300 |
| The mount board 12 | ceramics | approximately 70 to approximately 80 |
| The motherboard 201 | glass epoxy | approximately 10 to approximately 20 |
| The cover layers 20 and 22 | epoxy, polyimide | smaller than approximately 10 |

Referring to table 1, the Young's modulus of the piezoelectric substrate 17 is larger than that of the mount board 12, the cover layers 20 and 22, and the motherboard 201. As materials for the piezoelectric substrate 17, the mount board 12, the motherboard 201, and the cover layers 20 and 22, materials having substantially the same coefficient of linear expansion are used.

The circuit module 10 having the above-described structure operates as follows. In a case where a transmission signal is transmitted from a radio communication apparatus including the circuit module 10, a transmission circuit generates a transmission signal. The transmission signal is transmitted to an antenna via the duplexer 14. The SAW filter 32a in the duplexer 14 has a characteristic with which the transmission signal is transmitted between the bumps 25c and 25d and a receiving signal is not transmitted between the bumps 25c and 25d. Accordingly, a receiving signal that has been received by the antenna and input into the SAW filter 32a from the bump 25d cannot be output from the bump 25c. Thus, the entering of a receiving signal into a transmission circuit is prevented from occurring.

In a case where a radio communication apparatus including the circuit module 10 receives a receiving signal, an antenna receives the receiving signal. The receiving signal passes through the duplexer 14 and is transmitted to a receiving circuit. The SAW filter 32b in the duplexer 14 has a characteristic with which a receiving signal input from the bump 24b is separated into signals of opposite phases and the signals are individually output from the bumps 24d and 24f. Accordingly, a transmission signal that has been generated by a transmission circuit and input into the SAW filter 32b from the bump 24b cannot be output from the bump 24d. A receiving signal that has been received by an antenna and input into the SAW filter 32b from the bump 24b cannot be output from the bumps 24d and 24f. Thus, the entering of a transmission signal and a receiving signal into a receiving circuit is prevented from occurring.

With the circuit module 10 and the composite circuit module 200 according to preferred embodiments of the present invention, it is possible to prevent a connection in the circuit module 10 from being broken or damaged at the time of heating and cooling in a reflowing process. In the electronic component apparatus 500 disclosed in Japanese Unexamined Patent Application Publication No. 2002-299996, the piezoelectric monocrystal substrate 506 is made of, for example, lithium tantalite. The base 504 is made of, for example, ceramics such as alumina. A motherboard is made of, for example, a glass epoxy resin. Lithium tantalite, alumina, and glass epoxy have different material properties such as a coefficient of linear expansion and a Young's modulus. Accordingly, when the electronic component apparatus 500 is heated and cooled in a reflowing process, the SAW device 502, the base 504, and a motherboard are deformed in different ways. As a result, in the electronic component apparatus 500, a connection may be broken or damaged. In particular, the connection between the SAW device 502 and the base 504 may be broken or damaged.

In the SAW filters 32a and 32b in the circuit module 10 and the composite circuit module 200 according to preferred embodiments of the present invention, the support layer 18 and the cover layers 20 and 22 cover the main surface S1 of the piezoelectric substrate 17 with the air gap Sp on the longitudinal coupling portions (surface acoustic wave elements) 70 and 74, the shunt traps 76 and 78, and the series traps 80 and 82. The bumps 24a to 24f are disposed on the cover layer 22 and are electrically connected to the longitudinal coupling portions 70 and 74, the shunt traps 76 and 78, and the series traps 80 and 82. As a result, the SAW filters 32a and 32b are directly mounted on the mount board 12. That is, with the circuit module 10 and the composite circuit module 200 according to preferred embodiments of the present invention, the need to dispose the base 504 made of ceramics such as alumina is eliminated and the profile of the SAW device 502 is reduced. In the circuit module 10 and the composite circuit module 200 according to preferred embodiments of the present invention, there is no connection between the SAW device 502 and the base 504 which is easily broken or damaged. As a result, with the circuit module 10 and the composite circuit module 200 according to preferred embodiments of the present invention, it is possible to prevent a connection in the circuit module 10 from being broken or damaged at the time of heating and cooling in a reflowing process.

In the circuit module 10 and the composite circuit module 200 according to preferred embodiments of the present invention, the bumps 24a to 24f are solder bumps. Since the Young's modulus of a solder bump is smaller than that of a gold bump, the solder bump is easily deformed. Accordingly, even in a case where the mount board 12 and the piezoelectric substrate 17 are deformed by heating, the bumps 24a to 24f are more significantly deformed than a gold bump and are therefore hardly broken. As a result, in the circuit module 10 and the composite circuit module 200 according to preferred embodiments of the present invention, it is possible to prevent a connection in the circuit module 10 from being broken. As described previously with reference to table 1, since the cover layers 20 and 22, the mount board 12, and the motherboard 201 have Young's moduli smaller than that of the piezoelectric substrate 17, they are more easily deformed than the piezoelectric substrate 17. Since a deformation caused by heat or mechanical shock can be absorbed by components other than the piezoelectric substrate 17, it is possible to prevent a connection in the circuit module 10 from being broken or damaged even in a case where the bumps 24a to 24f are gold bumps.

In the circuit module 10 and the composite circuit module 200 according to preferred embodiments of the present invention, the Young's modulus of the piezoelectric substrate 17 is larger than that of the mount board 12, the cover layers 20 and 22, and the motherboard 201. Since a stress generated in the circuit module 10 can be scattered by the cover layers 20 and 22 and the mount board 12 having small Young's moduli, a stress concentration can be significantly reduced and prevented. It is therefore possible to more effectively prevent a connection in the circuit module 10 from being broken or damaged.

A coefficient of linear expansion may be set for each material with a Young's modulus used in a preferred embodiment of the present invention. By using materials with substantially the same coefficient of linear expansion for the piezoelectric substrate 17, the cover layers 20 and 22, the mount board 12, and the motherboard 201, the differences in expansion and shrinkage among them when they are heated can be reduced. As a result, it is possible to prevent the connection between the piezoelectric substrate 17 and the mount board 12 or the connection between the mount board 12 and the motherboard 201 from being broken or damaged by a stress concentration.

As described previously, preferred embodiments of the present invention are useful for a circuit module and a composite circuit module, and, in particular, provide an advantage in their suitability to prevent a connection in the circuit module from being broken or damaged at the time of heating in a reflowing process.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite circuit module comprising:
   a circuit module including:
      a surface acoustic wave filter including a piezoelectric substrate, a surface acoustic wave element disposed on a main surface of the piezoelectric substrate, a cover layer covering the main surface of the piezoelectric substrate with an air gap on the surface acoustic wave element, and a connection portion that is disposed on the cover layer and is electrically connected to the surface acoustic wave element; and
      a ceramic multilayer substrate on which the surface acoustic wave filter is mounted via the connection portion; and
   a motherboard on which the circuit module is mounted; wherein
   the ceramic multilayer substrate includes a substrate body including a first main surface and a second main surface and a first connection terminal disposed on the second main surface;
   the surface acoustic wave filter is disposed on the first main surface;
   the ceramic multilayer substrate is mounted on the motherboard via the first connection terminal;
   the piezoelectric substrate, the ceramic multilayer substrate, the cover layer, and the motherboard have substantially the same coefficient of linear expansion;
   a Young's modulus of the piezoelectric substrate is larger than a Young's modulus of the ceramic multilayer substrate, a Young's modulus of the cover layer, and a Young's modulus of the motherboard;
   the Young's modulus of the ceramic multilayer substrate is larger than the Young's modulus of the motherboard and the Young's modulus of the cover layer;
   the Young's modulus of the motherboard is larger than the Young's modulus of the cover layer; and
   the Young's modulus of the ceramic multilayer substrate is from 70/9 to 80/9 times the Young's modulus of the cover layer and from 7/30 to 2/5 times the Young's modulus of the piezoelectric substrate.

2. The composite circuit module according to claim 1, wherein the ceramic multilayer substrate includes a second connection terminal disposed on the first main surface, and the connection portion and the second connection terminal are connected.

3. The composite circuit module according to claim 1, wherein the connection portion includes a solder bump.

4. A composite circuit module comprising:
   a circuit module including:
      a surface acoustic wave filter including a piezoelectric substrate, a surface acoustic wave element disposed on a main surface of the piezoelectric substrate, a cover layer covering the main surface of the piezoelectric substrate with an air gap on the surface acoustic wave element, and a connection portion that is disposed on the cover layer and is electrically connected to the surface acoustic wave element; and
      a ceramic multilayer substrate on which the surface acoustic wave filter is mounted via the connection portion; and
   a motherboard on which the circuit module is mounted; wherein
   the ceramic multilayer substrate includes a substrate body including a first main surface and a second main surface and a first connection terminal disposed on the second main surface;
   the surface acoustic wave filter is disposed on the first main surface;
   the ceramic multilayer substrate is mounted on the motherboard via the first connection terminal;
   the piezoelectric substrate, the ceramic multilayer substrate, the cover layer, and the motherboard have substantially the same coefficient of linear expansion;
   a Young's modulus of the piezoelectric substrate is larger than a Young's modulus of the ceramic multilayer substrate, a Young's modulus of the cover layer, and a Young's modulus of the motherboard;
   the Young's modulus of the ceramic multilayer substrate is larger than the Young's modulus of the motherboard and the Young's modulus of the cover layer;
   the Young's modulus of the motherboard is larger than the Young's modulus of the cover layer; and
   the Young's modulus of the ceramic multilayer substrate is from 70 GPa to 80 GPa.

5. The composite circuit module according to claim 4, wherein the ceramic multilayer substrate includes a second connection terminal disposed on the first main surface, and the connection portion and the second connection terminal are connected.

6. The composite circuit module according to claim 4, wherein the connection portion includes a solder bump.

* * * * *